United States Patent
Hwang et al.

(10) Patent No.: US 11,233,512 B2
(45) Date of Patent: Jan. 25, 2022

(54) BUFFER CIRCUIT, RECEIVER CIRCUIT INCLUDING THE BUFFER CIRCUIT, AND SEMICONDUCTOR APPARATUS INCLUDING THE RECEIVER CIRCUIT

(71) Applicant: SK hynix Inc., Icheon-si (KR)

(72) Inventors: Jin Ha Hwang, Icheon-si (KR); Yo Han Jeong, Icheon-si (KR); Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/017,494

(22) Filed: Sep. 10, 2020

(65) Prior Publication Data

US 2021/0367600 A1    Nov. 25, 2021

(30) Foreign Application Priority Data

May 19, 2020    (KR) ........................ 10-2020-0059675

(51) Int. Cl.
| | |
|---|---|
| *H03K 19/0185* | (2006.01) |
| *H03K 19/20* | (2006.01) |
| *G11C 7/10* | (2006.01) |
| *H03K 19/08* | (2006.01) |

(52) U.S. Cl.
CPC ... *H03K 19/018521* (2013.01); *G11C 7/1084* (2013.01); *G11C 7/1096* (2013.01); *H03K 19/08* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 2011/0102043 A1* | 5/2011 | Zerbe | ................... H03H 11/265 327/261 |
| 2013/0051495 A1* | 2/2013 | Shawwa | ............. H03K 5/1565 375/316 |
| 2014/0159777 A1 | 6/2014 | Seong | |
| 2015/0109036 A1* | 4/2015 | Gomm | ................. H03K 5/1565 327/158 |
| 2015/0270995 A1* | 9/2015 | Kim | ........................ H04B 1/24 375/320 |
| 2018/0294784 A1 | 10/2018 | Kim et al. | |

FOREIGN PATENT DOCUMENTS

KR    1020210040552 A    4/2021

* cited by examiner

*Primary Examiner* — Jany Richardson
(74) *Attorney, Agent, or Firm* — William Park & Associates Ltd.

(57) ABSTRACT

The present technology may include: a first logic gate coupled to an internal voltage terminal and configured to receive data and invert and output the data according to a first enable signal; and a second logic gate coupled to the internal voltage terminal and configured to invert an output of the first logic gate and to output an inverted output as a first buffer signal according to the first enable signal, and configured to compensate for a duty skew of the first buffer signal according to a level of an external voltage.

20 Claims, 4 Drawing Sheets

BUFFER CIRCUIT, RECEIVER CIRCUIT INCLUDING THE BUFFER CIRCUIT, AND SEMICONDUCTOR APPARATUS INCLUDING THE RECEIVER CIRCUIT

CROSS-REFERENCES TO RELATED APPLICATION

The present application claims priority under 35 U.S.C. § 119(a) to Korean application number 10-2020-0059675, filed on May 19, 2020, in the Korean Intellectual Property Office, which is incorporated herein by reference in its entirety.

BACKGROUND

1. Technical Field

Various embodiments generally relate to a semiconductor circuit, and particularly, to a buffer circuit, a receiver circuit including the buffer circuit, and a semiconductor apparatus including the receiver circuit.

2. Related Art

A semiconductor apparatus includes a receiver circuit for receiving an input signal provided from an exterior.

The receiver circuit may operate according to a heterogeneous power supply voltage, that is, a power supply voltage provided from an exterior (hereinafter, referred to as an external power supply voltage) and/or a power supply voltage generated in an interior (hereinafter, referred to as an internal power supply voltage).

It is very important that the receiver circuit has stable output characteristics regardless of variations in the heterogeneous power supply voltage.

SUMMARY

In an embodiment, a buffer circuit may include a first logic gate coupled to an internal voltage terminal and configured to receive data and invert and output the data according to a first enable signal; and a second logic gate coupled to the internal voltage terminal and configured to invert an output of the first logic gate and to output an inverted output as a first buffer signal according to the first enable signal, and configured to compensate for a duty skew of the first buffer signal according to a level of an external voltage.

In an embodiment, a receiver circuit may include: a first buffer circuit coupled to an internal voltage terminal and configured to receive data and output the data as a first buffer signal according to a first enable signal and to compensate for a duty skew of the first buffer signal according to an external voltage; and a second buffer circuit configured to receive the data and output the data as a second buffer signal in response to a reference voltage according to a second enable signal, wherein an output terminal of the first buffer circuit and an output terminal of the second buffer circuit are connected to each other.

In an embodiment, a semiconductor apparatus may include: a receiver circuit coupled to an internal voltage terminal and configured to generate reception data by performing a first data reception operation of receiving data and outputting the data as a first buffer signal according to a first enable signal and compensating for a duty skew of the first buffer signal according to an external voltage; a memory area; and a write path circuit including circuit configurations for writing the reception data in the memory area.

DETAILED DESCRIPTION

Hereinafter, embodiments of the present disclosure will be described with reference to the drawings.

Various embodiments may be directed to providing a buffer circuit capable of having stable output characteristics regardless of variations in a power supply voltage, a receiver circuit including the buffer circuit, and a semiconductor apparatus including the receiver circuit.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Various embodiments of the present disclosure will be described hereinafter in detail with reference to the accompanying drawings. However, the embodiments described herein are for illustrative purposes only and are not intended to limit the scope of the present disclosure.

Figure 1:
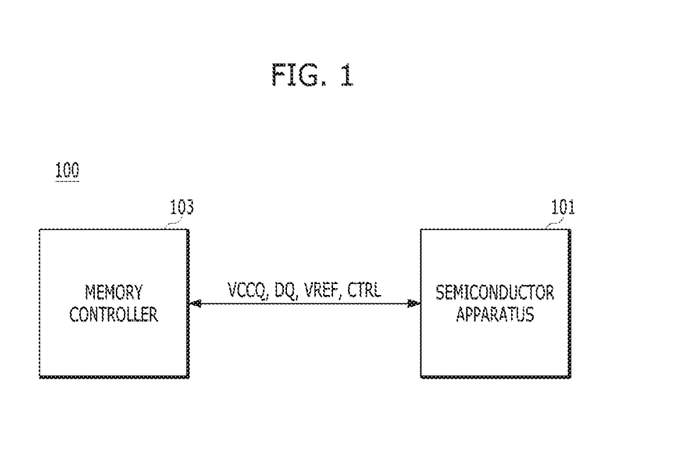
FIG. 1 is a diagram illustrating a configuration of a semiconductor system in accordance with an embodiment.

FIG. 1 is a diagram illustrating a configuration of a semiconductor system 100 in accordance with an embodiment.

Referring to FIG. 1, the semiconductor system 100 in accordance with an embodiment may include a semiconductor apparatus 101 and a memory controller 103.

The memory controller 103 may provide the semiconductor apparatus 101 with a power supply voltage, data DQ, a reference voltage VREF, and/or a control signal CRTL.

The power supply voltage is power for an operation of the semiconductor apparatus 101 and is hereinafter referred to as an external voltage VCCQ.

The control signal CRTL may include a plurality of signals, that is, commands, addresses, and various signals for controlling data reception of the semiconductor apparatus 101.

The various signals for controlling data reception may have different values depending on an operation mode of the semiconductor apparatus 101. The various signals for controlling data reception may have different values depending on, for example, a low-speed mode, a high-speed mode, and the like defined in the specifications of the semiconductor apparatus 101, which will be described below.

The memory controller 103 may receive data DQ provided from the semiconductor apparatus 101.

The semiconductor apparatus 101 may include a volatile memory apparatus such as a DRAM and/or a nonvolatile memory apparatus such as a NAND FLASH.

The semiconductor apparatus 101 may receive data DQ provided from the memory controller 103 and write the data DQ in an internal memory area according to the control signal CRTL, or read the data DQ written in the internal memory area and provide the data DQ to the memory controller 103 according to the control signal CRTL.

Figure 2:
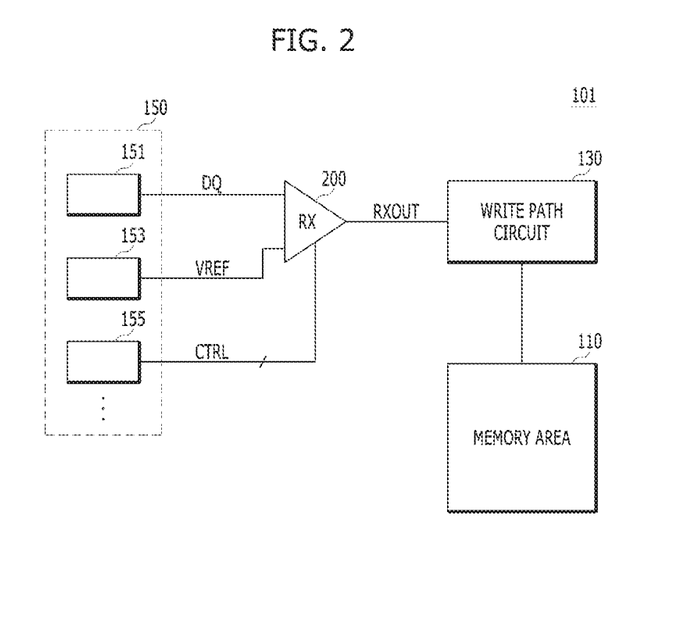
FIG. 2 is a diagram illustrating a configuration of a semiconductor apparatus in accordance with an embodiment.

FIG. 2 is a diagram illustrating a configuration of a semiconductor apparatus in accordance with an embodiment.

Referring to FIG. 2, the semiconductor apparatus 101 in accordance with an embodiment may include a memory area 110, a write path circuit 130, a pad array 150, and a receiver circuit 200.

The memory area 110 may include a volatile memory cell array (for example, a DRAM) and/or a nonvolatile memory cell array (for example, a NAND FLASH), and various circuits for data input/output between the memory cell arrays and an exterior of the memory area 110.

The write path circuit 130 may include various circuit configurations for writing reception data RXOUT in the memory area 110.

The pad array 150 may include pads 151, 153, 155, ... for receiving the data DQ, the reference voltage VREF, and the control signal CRTL.

The receiver circuit (RX) 200 may selectively perform a first data reception operation of receiving the data DQ regardless of the reference voltage VREF and a second data reception operation of receiving the data DQ in response to the reference voltage VREF, according to the control signal CRTL.

The receiver circuit 200 may output, as the reception data RXOUT, a result of the first data reception operation or a result of the second data reception operation.

Figure 3:
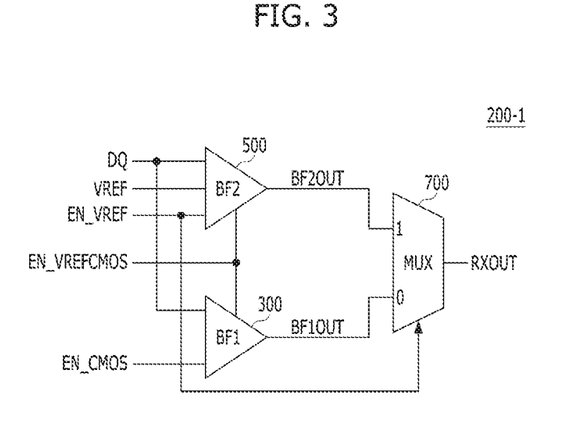
FIG. 3 is a diagram illustrating a configuration of a receiver circuit in accordance with an embodiment.

FIG. 3 is a diagram illustrating a configuration of the receiver circuit 200 in accordance with an embodiment.

The receiver circuit 200 of FIG. 2 may be implemented in various methods, and FIG. 3 is a diagram illustrating a configuration of a receiver circuit 200-1 in accordance with an embodiment.

Referring to FIG. 3, the receiver circuit 200-1 in accordance with an embodiment may include a first buffer circuit (BF1) 300, a second buffer circuit (BF2) 500, and a multiplexing circuit (MUX) 700.

The BF1 300 may perform the first data reception operation of receiving the data DQ and outputting the data DQ as a first buffer signal BF1OUT, when a first enable signal EN_CMOS is enabled.

When a third enable signal EN_VREFCMOS is disabled, the BF1 300 may fix the first buffer signal BF1OUT to a predetermined level, thereby substantially preventing the first buffer signal BF1OUT from transitioning. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The BF2 500 may perform the second data reception operation of receiving the data DQ and outputting the data DQ as a second buffer signal BF2OUT according to the reference voltage VREF when a second enable signal EN_VREF is enabled.

The BF2 500 may fix the second buffer signal BF2OUT to a predetermined level according to the third enable signal EN_VREFCMOS, thereby substantially preventing the second buffer signal BF2OUT from transitioning.

The MUX 700 may output one of the first buffer signal BF1OUT and the second buffer signal BF2OUT as the reception data RXOUT according to the second enable signal EN_VREF.

The control signal CRTL described with reference to FIG. 1 and FIG. 2 may include the first enable signal EN_CMOS, the second enable signal EN_VREF, and the third enable signal EN_VREFCMOS.

When operating the semiconductor apparatus 101 in a low-speed mode defined in the specifications, the memory controller 103 may enable the first enable signal EN_CMOS to a high level, for example, and may disable the second enable signal EN_VREF to a low level, for example. The low-speed mode may refer to an operation mode in which an operating frequency of the semiconductor apparatus 101 is selected as a first value defined in the specifications. As the first enable signal EN_CMOS is enabled and the second enable signal EN_VREF is disabled, the BF1 300 suitable for the low-speed operation may be selected and the first data reception operation may be performed.

When operating the semiconductor apparatus 101 in a high-speed mode defined in the specifications, the memory controller 103 may disable the first enable signal EN_CMOS to a low level, and may enable the second enable signal EN_VREF to a high level. The high-speed mode may refer to an operation mode in which the operating frequency of the semiconductor apparatus 101 is selected as a second value higher than the first value defined in the specifications. As the first enable signal EN_CMOS is disabled and the second enable signal EN_VREF is enabled, the BF2 500 suitable for the high-speed operation may be selected and the second data reception operation may be performed.

The third enable signal EN_VREFCMOS is a signal for substantially preventing output levels of the BF1 300 and the BF2 500 from transitioning while data reception is not performed. Since the third enable signal EN_VREFCMOS is disabled only when both the first enable signal EN_CMOS and the second enable signal EN_VREF are disabled, the third enable signal EN_VREFCMOS may be generated by performing a logic OR operation with the first enable signal EN_CMOS and the second enable signal EN_VREF.

Figure 4:
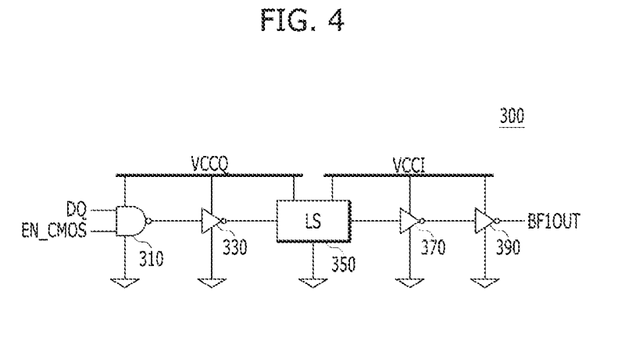
FIG. 4 is a diagram illustrating a configuration of a first buffer of FIG. 3.

FIG. 4 is a diagram illustrating a configuration of the BF1 300 of FIG. 3.

Referring to FIG. 4, the BF1 300 of FIG. 3 may include a first logic gate 310, a second logic gate 330, a level shifter (LS) 350, a third logic gate 370, and a fourth logic gate 390.

The first logic gate 310 and the second logic gate 330 may operate according to the external voltage VCCQ.

The external voltage VCCQ may be provided from an exterior of the semiconductor apparatus 101, for example, from the memory controller 103.

The third logic gate 370 and the fourth logic gate 390 may operate according to an internal voltage VCCI.

The internal voltage VCCI may be generated in the semiconductor apparatus 101 by using the external voltage VCCQ.

The first logic gate 310 may be configured as a NAND gate, and may invert and output the data DQ when the first enable signal EN_CMOS is at a high level.

The second logic gate 330 may be configured as an inverter, and may invert and output the output of the first logic gate 310.

The LS 350 may convert the level of an output signal of the second logic gate 330 into a level of the internal voltage VCCI, and output the signal.

Each of the third logic gate 370 and the fourth logic gate 390 may be configured as an inverter, and may buffer the output of the LS 350 and output the buffered output as the first buffer signal BF1OUT.

Figure 5:
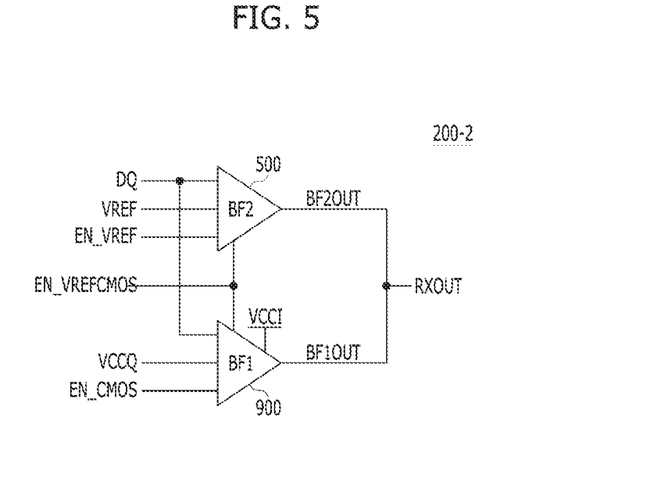
FIG. 5 is a diagram illustrating a configuration of a receiver circuit in accordance with another embodiment.

FIG. 5 is a diagram illustrating a configuration of a receiver circuit in accordance with another embodiment.

The receiver circuit 200 of FIG. 2 may be implemented in various methods, and FIG. 5 is a diagram illustrating a configuration of a receiver circuit 200-2 in accordance with another embodiment.

Referring to FIG. 5, the receiver circuit 200-2 in accordance with another embodiment may include a first buffer circuit (BF1) 900 and a second buffer circuit (BF2) 500.

The first buffer circuit BF1 900 uses the internal voltage VCCI as power, and may be configured to perform a first data reception operation of receiving the data DQ, outputting the data as the first buffer signal BF1OUT, and compensating for the duty skew of the first buffer signal BF1OUT according to the external voltage VCCQ when the first enable signal EN_CMOS is enabled.

When the third enable signal EN_VREFCMOS is disabled, the first buffer circuit BF1 900 may fix the first buffer signal BF1OUT to a predetermined level, thereby substantially preventing the first buffer signal BF1OUT from transitioning. In an embodiment, the first buffer circuit BF1 900 may fix the first buffer signal BF1OUT to a predetermined level according to a third enable signal EN_VREFCMOS.

The second buffer circuit BF2 500 may perform a second data reception operation of receiving the data DQ and outputting the data DQ as the second buffer signal BF2OUT according to the reference voltage VREF, when the second enable signal EN_VREF is enabled.

The second buffer circuit BF2 500 may fix the second buffer signal BF2OUT to a predetermined level according to the third enable signal EN_VREFCMOS, thereby substantially preventing the second buffer signal BF2OUT from transitioning.

Figure 6:
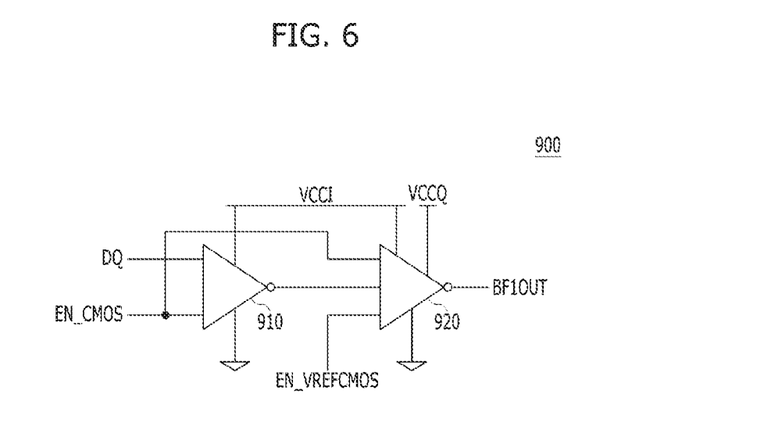
FIG. 6 is a diagram illustrating a configuration of a first buffer of FIG. 5.

FIG. 6 is a diagram illustrating a configuration of the BF1 900 of FIG. 5.

Referring to FIG. 6, the BF1 900 of FIG. 5 may include a first logic gate 910 and a second logic gate 920.

The first logic gate 910 and the second logic gate 920 may use the internal voltage VCCI as power. In an embodiment, the first logic gate 910 and the second logic gate 920 may be coupled to an internal voltage VCCI terminal to receive the internal voltage VCCI as power. In an embodiment, an internal voltage VCCI terminal may supply power to the first and second logic gates 910 and 920.

The first logic gate 910 and the second logic gate 920 may operate according to the internal voltage VCCI.

The first logic gate 910 may be configured as a three-state inverter, and may invert and output the data DQ when the first enable signal EN_CMOS is at a high level. In an embodiment, the first logic gate 910 may be configured as a three-state inverter, and may invert and output the data DQ when the first enable signal EN_CMOS is at a high level to output a resultant signal.

The second logic gate 920 may be configured as a three-state inverter, and may invert the output of the first logic gate 910 and output the inverted output as the first buffer signal BF1OUT, when the first enable signal EN_CMOS is at a high level. In an embodiment, the second logic gate 920 may be configured as a three-state inverter, and may invert the resultant signal of the first logic gate 910 to output the resultant signal as the inverted output and output the inverted output as the first buffer signal BF1OUT, when the first enable signal EN_CMOS is at a high level.

The second logic gate 920 may adjust the amount of a sink current according to the level of the external voltage VCCQ, and compensate for the duty skew of the first buffer signal BF1OUT generated according to a difference between the internal voltage VCCI and the external voltage VCCQ.

When the third enable signal EN_VREFCMOS is disabled, the second logic gate 920 may fix the first buffer signal BF1OUT to a predetermined level, thereby substantially preventing the first buffer signal BF1OUT from transitioning.

Figure 7:
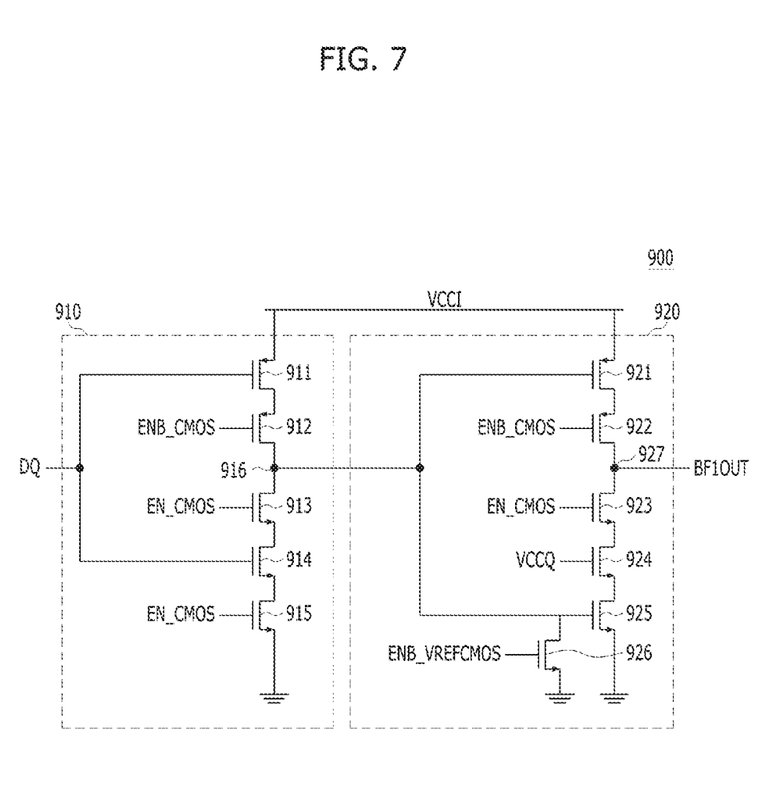
FIG. 7 is a diagram illustrating an example of a circuit configuration of the first buffer of FIG. 5.

FIG. 7 is a diagram illustrating an example of a circuit configuration of the BF1 900 of FIG. 5.

Referring to FIG. 7, the first logic gate 910 of the BF1 900 may include first to fifth transistors 911 to 915.

The first transistor 911 may be connected to a terminal of the internal voltage VCCI through a source thereof and receive the data DQ through a gate thereof.

The second transistor 912 may be connected to a drain of the first transistor 911 through a source thereof, receive an inverted first enable signal ENB_CMOS through a gate thereof, and be connected to a first output node 916 through a drain thereof.

The inverted first enable signal ENB_CMOS may be generated by inverting the first enable signal EN_CMOS through an inverter, or may be provided from an exterior of the semiconductor apparatus 101.

The third transistor 913 may be connected to the first output node 916 through a source thereof and receive the first enable signal EN_CMOS through a gate thereof.

The fourth transistor 914 may be connected to a drain of the third transistor 913 through a source thereof and receive the data DQ through a gate thereof.

The fifth transistor 915 may be connected to a drain of the fourth transistor 914 through a source thereof, receive the first enable signal EN_CMOS through a gate thereof, and be connected to a ground terminal through a drain thereof.

When the first enable signal EN_CMOS is at a high level, the first logic gate 910 may invert and output the data DQ.

The second logic gate 920 of the BF1 900 may include first to sixth transistors 921 to 926.

The first transistor 921 may be connected to a terminal of the internal voltage VCCI through a source thereof and may be connected to the first output node 916 through a gate thereof.

The second transistor 922 may be connected to a drain of the first transistor 921 through a source thereof, receive the inverted first enable signal ENB_CMOS through a gate thereof, and be connected to a second output node 927 through a drain thereof.

The first buffer signal BF1OUT may be output through the second output node 927.

The third transistor 923 may be connected to the second output node 927 through a source thereof and receive the first enable signal EN_CMOS through a gate thereof.

The fourth transistor 924 may be connected to a drain of the third transistor 923 through a source thereof and receive the external voltage VCCQ through a gate thereof.

The fourth transistor 924 may compensate for the duty skew of the first buffer signal BF1OUT according to the level of the external voltage VCCQ.

The fifth transistor 925 may be connected to a drain of the fourth transistor 924 through a source thereof and be connected to the first output node 916 through a gate thereof.

The sixth transistor 926 may be connected in common to a gate of the fifth transistor 925 and the first output node 916 through a source thereof, receive an inverted third enable signal ENB_VREFCMOS through a gate thereof, and may be connected to the ground terminal through a drain thereof.

When the third enable signal EN_VREFCMOS is at a high level, the sixth transistor 926 may fix the first buffer signal BF1OUT to a predetermined level, thereby substantially preventing the first buffer signal BF1OUT from transitioning.

The inverted third enable signal ENB_VREFCMOS may be generated by inverting the third enable signal EN_VREFCMOS through an inverter, or may be provided from an exterior of the semiconductor apparatus 101.

When the first enable signal EN_CMOS is at a high level, the second logic gate 920 may invert and output the output signal of the first logic gate 910, and substantially prevent an increase in the duty of the first buffer signal BF1OUT due to a difference between the levels of the external voltage VCCQ and the internal voltage VCCI.

When the level of the external voltage VCCQ is higher than that of the internal voltage VCCI, the duty of the first buffer signal BF1OUT may be increased beyond a target value.

Accordingly, the external voltage VCCQ is applied to the gate of the fourth transistor 924 of the second logic gate 920 so as to compensate for an increase in the duty due to an increase in the level of the external voltage VCCQ, and when the level of the external voltage VCCQ is higher than that of the internal voltage VCCI, it is possible to substantially prevent an increase in the duty of the first buffer signal BF1OUT by increasing a sink current through the fourth transistor 924.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:

1. A buffer circuit comprising:
   a first logic gate coupled to an internal voltage terminal and configured to receive data and invert and output the data according to a first enable signal; and
   a second logic gate coupled to the internal voltage terminal and configured to invert an output of the first logic gate to output an inverted output as a first buffer signal according to the first enable signal, and configured to compensate for a duty skew of the first buffer signal according to a level of an external voltage.

2. The buffer circuit according to claim 1, wherein the first logic gate comprises:
   a first transistor comprising a source for receiving the internal voltage and a gate for receiving the data;
   a second transistor comprising a source connected to a drain of the first transistor, a gate for receiving an inverted first enable signal, and a drain connected to an output node for outputting the first buffer signal;
   a third transistor comprising a source connected to the output node for outputting the first buffer signal and a gate for receiving the first enable signal; and
   a fourth transistor comprising a source connected to a drain of the third transistor and a gate for receiving the data.

3. The buffer circuit according to claim 1, wherein the second logic gate comprises:
   a first transistor comprising a source for receiving the internal voltage and a gate for receiving the output of the first logic gate;
   a second transistor comprising a source connected to a drain of the first transistor, a gate for receiving the inverted first enable signal, and a drain connected to the output node for outputting the first buffer signal;
   a third transistor comprising a source connected to the output node for outputting the first buffer signal and a gate for receiving the first enable signal;
   a fourth transistor comprising a source connected to a drain of the third transistor and a gate for receiving the external voltage, and configured to compensate for a duty skew of the first buffer signal according to the external voltage; and
   a fifth transistor comprising a source connected to a drain of the fourth transistor, a gate for receiving the output of the first logic gate, and a drain connected to a ground terminal.

4. A receiver circuit comprising:
   a first buffer circuit coupled to an internal voltage terminal and configured to receive data and output the data as a first buffer signal according to a first enable signal and to compensate for a duty skew of the first buffer signal according to an external voltage; and
   a second buffer circuit configured to receive the data and output the data as a second buffer signal in response to a reference voltage according to a second enable signal, wherein an output terminal of the first buffer circuit and an output terminal of the second buffer circuit are connected to each other.

5. The receiver circuit according to claim 4, wherein the first buffer circuit is configured to fix the first buffer signal to a predetermined level according to a third enable signal.

6. The receiver circuit according to claim 4, wherein the second buffer circuit is configured to fix the second buffer signal to a predetermined level according to the third enable signal.

7. The receiver circuit according to claim 4, wherein the first buffer circuit comprises:
a first logic gate coupled to the internal voltage terminal and configured to receive data and invert and output the data according to the first enable signal; and
a second logic gate coupled to the internal voltage terminal and configured to invert an output of the first logic gate to output an inverted output as the first buffer signal according to the first enable signal, and configured to compensate for a duty skew of the first buffer signal according to a level of the external voltage.

8. The receiver circuit according to claim 7, wherein the first logic gate comprises:
a first transistor comprising a source for receiving the internal voltage and a gate for receiving the data;
a second transistor comprising a source connected to a drain of the first transistor, a gate for receiving an inverted first enable signal, and a drain connected to an output node for outputting the first buffer signal;
a third transistor comprising a source connected to the output node for outputting the first buffer signal and a gate for receiving the first enable signal; and
a fourth transistor comprising a source connected to a drain of the third transistor and a gate for receiving the data.

9. The receiver circuit according to claim 7, wherein the second logic gate comprises:
a first transistor comprising a source for receiving the internal voltage and a gate for receiving output of the first logic gate;
a second transistor comprising a source connected to a drain of the first transistor, a gate for receiving the inverted first enable signal, and a drain connected to the output node for outputting the first buffer signal;
a third transistor comprising a source connected to the output node for outputting the first buffer signal and a gate for receiving the first enable signal;
a fourth transistor comprising a source connected to a drain of the third transistor and a gate for receiving the external voltage, and configured to compensate for a duty skew of the first buffer signal according to the external voltage; and
a fifth transistor comprising a source connected to a drain of the fourth transistor, a gate for receiving the output of the first logic gate, and a drain connected to a ground terminal.

10. A semiconductor apparatus comprising:
a receiver circuit coupled to an internal voltage terminal and configured to generate reception data by performing a first data reception operation of receiving data and outputting the data as a first buffer signal according to a first enable signal and compensating for a duty skew of the first buffer signal according to an external voltage;
a memory area; and
a write path circuit including circuit configurations for writing the reception data in the memory area.

11. The semiconductor apparatus according to claim 10, wherein the memory area includes at least one of a volatile memory cell array and a nonvolatile memory cell array.

12. The semiconductor apparatus according to claim 10, wherein the receiver circuit is configured to perform a second data reception operation of receiving the data and outputting the data as a second buffer signal in response to a reference voltage according to a second enable signal.

13. The semiconductor apparatus according to claim 12, wherein, when the semiconductor apparatus is set to operate in a low-speed mode, the first data reception operation is performed in response to receiving a control signal by the semiconductor apparatus that includes the second enable signal, disabled, and the first enable signal, enabled.

14. The semiconductor apparatus according to claim 13, wherein, when the semiconductor apparatus is set to operate in a high-speed mode, the second data reception operation is performed in response to receiving a control signal by the semiconductor apparatus that includes the first enable signal, disabled, and the second enable signal, enabled.

15. The semiconductor apparatus according to claim 12, wherein the receiver circuit comprises:
a first buffer circuit coupled to an internal voltage terminal, and configured to receive the data and output the data as the first buffer signal according to a first enable signal and to compensate for the duty skew of the first buffer signal according to the external voltage; and
a second buffer circuit configured to receive the data and output the data as the second buffer signal in response to the reference voltage according to the second enable signal,
wherein an output terminal of the first buffer circuit and an output terminal of the second buffer circuit are connected to each other.

16. The semiconductor apparatus according to claim 15, wherein the first buffer circuit is configured to fix the first buffer signal to a predetermined level according to a third enable signal.

17. The semiconductor apparatus according to claim 15, wherein the second buffer circuit is configured to fix the second buffer signal to a predetermined level according to the third enable signal.

18. The semiconductor apparatus according to claim 15, wherein the first buffer circuit comprises:
a first logic gate coupled to the internal voltage terminal and configured to receive data and invert and output the data according to the first enable signal; and
a second logic gate coupled to the internal voltage terminal and configured to invert an output of the first logic gate and to output an inverted output as the first buffer signal according to the first enable signal, and configured to compensate for a duty skew of the first buffer signal according to a level of the external voltage.

19. The semiconductor apparatus according to claim 18, wherein the first logic gate comprises:
a first transistor comprising a source for receiving the internal voltage and a gate for receiving the data;
a second transistor comprising a source connected to a drain of the first transistor, a gate for receiving an inverted first enable signal, and a drain connected to an output node for outputting the first buffer signal;
a third transistor comprising a source connected to the output node for outputting the first buffer signal and a gate for receiving the first enable signal; and
a fourth transistor comprising a source connected to a drain of the third transistor and a gate for receiving the data.

20. The semiconductor apparatus according to claim 18, wherein the second logic gate comprises:
- a first transistor comprising a source for receiving the internal voltage and a gate for receiving output of the first logic gate;
- a second transistor comprising a source connected to a drain of the first transistor, a gate for receiving the inverted first enable signal, and a drain connected to the output node for outputting the first buffer signal;
- a third transistor comprising a source connected to the output node for outputting the first buffer signal and a gate for receiving the first enable signal;
- a fourth transistor comprising a source connected to a drain of the third transistor and a gate for receiving the external voltage, and configured to compensate for a duty skew of the first buffer signal according to the external voltage; and
- a fifth transistor comprising a source connected to a drain of the fourth transistor, a gate for receiving the output of the first logic gate, and a drain connected to a ground terminal.

* * * * *